United States Patent [19]
White

[11] Patent Number: 5,179,380
[45] Date of Patent: Jan. 12, 1993

[54] ONE-BIT SIGMA-DELTA MODULATOR WITH IMPROVED SIGNAL STABILITY

[75] Inventor: Stanley A. White, San Clemente, Calif.

[73] Assignee: Rockwell International Corporation, Seal Beach, Calif.

[21] Appl. No.: 832,515

[22] Filed: Feb. 7, 1992

[51] Int. Cl.⁵ .............................................. H03M 3/02
[52] U.S. Cl. ...................................... 341/143; 375/34
[58] Field of Search .................. 341/143, 118; 375/27, 375/28, 34

[56] References Cited

U.S. PATENT DOCUMENTS

| | | | |
|---|---|---|---|
| 4,829,299 | 5/1989 | Mandell | 341/77 |
| 4,940,977 | 7/1990 | Mandell | 341/143 |
| 5,027,120 | 6/1991 | Thurston | 341/143 |
| 5,039,989 | 8/1991 | Welland et al. | 341/143 |
| 5,055,843 | 10/1991 | Ferguson, Jr. et al. | 341/143 |

Primary Examiner—Marc Hoff
Attorney, Agent, or Firm—H. Fredrick Hamann; G. A. Montanye; Tom Streeter

[57] ABSTRACT

The one-bit sigma-delta modulator with improved signal stability disclosed herein includes, in order, a first anti-aliasing filter (20), a chopper (22), a second anti-aliasing filter (30), and a one-bit modulator (32). The chopper (22) and one-bit modulator (32) are driven by a clock generator (38). The chopper (22) is introduced to provide a carrier upon which the signal may ride, thereby eliminating dc stability problems. The first anti-aliasing filter (20) eliminates aliasing from the chopper (22), and the second anti-aliasing filter (30) eliminates aliasing from the one-bit modulator (32). The second anti-aliasing filter (30) may be eliminated if the frequency of the chopper (22) is an exact integer submultiple of the sampling frequency of the one-bit modulator (32). This invention may drive a decimation filter (36), also driven by the clock generator (38), to provide a low cost analog-to-digital converter.

14 Claims, 6 Drawing Sheets

ONE-BIT SIGMA-DELTA MODULATOR WITH IMPROVED SIGNAL STABILITY

BACKGROUND OF THE INVENTION

1. Technical Field

This invention relates to low-cost analog-to-digital conversion (ADC).

2. Background Art

A baseband signal is to be applied to a sigma-delta converter. The converter usually consists of a one-bit modulator and a decimation filter. The dc stability of the one-bit modulator is often a problem.

SUMMARY OF THE INVENTION

Applicant avoids this problem by placing the signal on a low-frequency carrier. This placement is accomplished by modulating the signal before the one-bit modulator, and then demodulating the signal within the decimation chain.

The purposes of the device herein described are to:
1. modulate a baseband signal onto a carrier to avoid offset problems,
2. perform low-cost (because of the lack of offset problems at the carrier frequency) analog-to-digital conversion; and,
3. perform digital demodulation (again, no offset problems, but this time because the demodulation and subsequent processing is digital).

The low-cost modulation approach is simple square-wave modulation, or "chopping." The means to avoid undesirable aliasing, or foldover distortion, caused by intermodulation products, is the use of the proper filtering in order to avoid images of either signal or noise from folding over onto the signal passband.

DETAILED DESCRIPTION OF A PREFERRED EMBODIMENT

Figure 1:
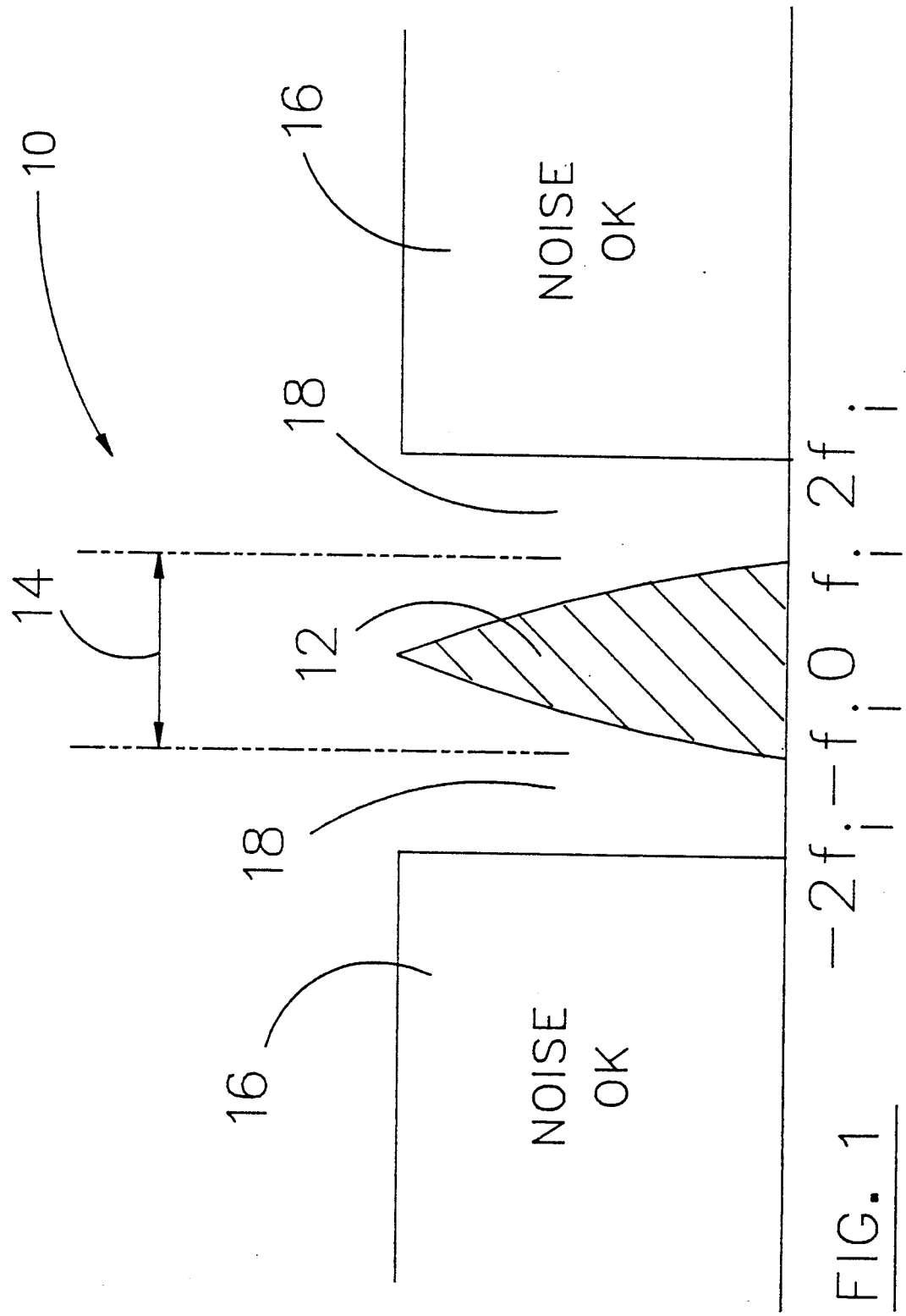
FIG. 1 shows a spectrum of a typical input waveform.

The spectrum of the input waveform 10, shown in FIG. 1, consists of signal components 12 for frequencies in the input band 14, $|f| \leq fi$, and unspecified noise components 16 for frequencies in the noise band, $|f| > 2fi$. Signal plus noise components that extend into the guard band 18, $fi < |f| < 2fi$, must be less than some prescribed level. This input waveform 10 is lowpass filtered by a first anti-aliasing filter 20 whose cutoff frequency is f1. This cutoff frequency avoids aliasing in signal-plus-noise spectra riding on the harmonics of the chopper waveform described below.

Figure 7:
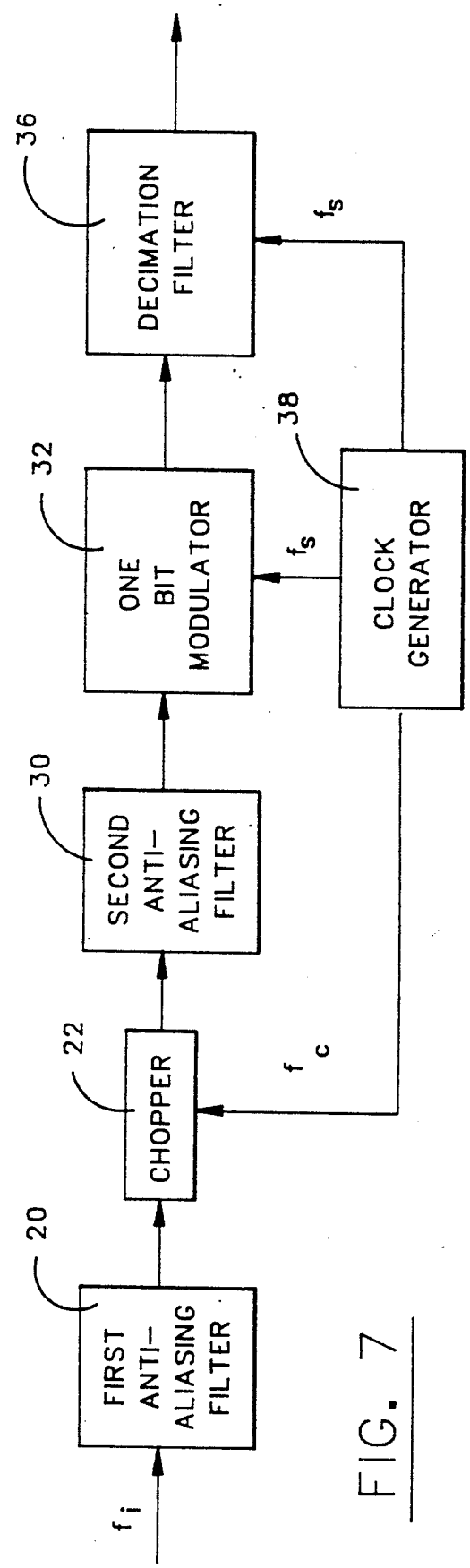
FIG. 7 is a block overview of the entire invention.

The output of the first anti-aliasing filter 20, hereafter referred to as the first filter signal, is multiplied by a zero-mean square wave whose amplitude is 1, i.e., the input signal is chopped. A chopper 22, as shown in FIG. 7, is suitable, and has an output which is hereafter called the chopper signal. Because a zero-mean square wave is used, there are no even-harmonic spectral components in the square wave; the amplitudes of the odd-harmonic spectral components are $2/(n*pi)$. The fundamental frequency of the square wave is fc.

Figure 2:
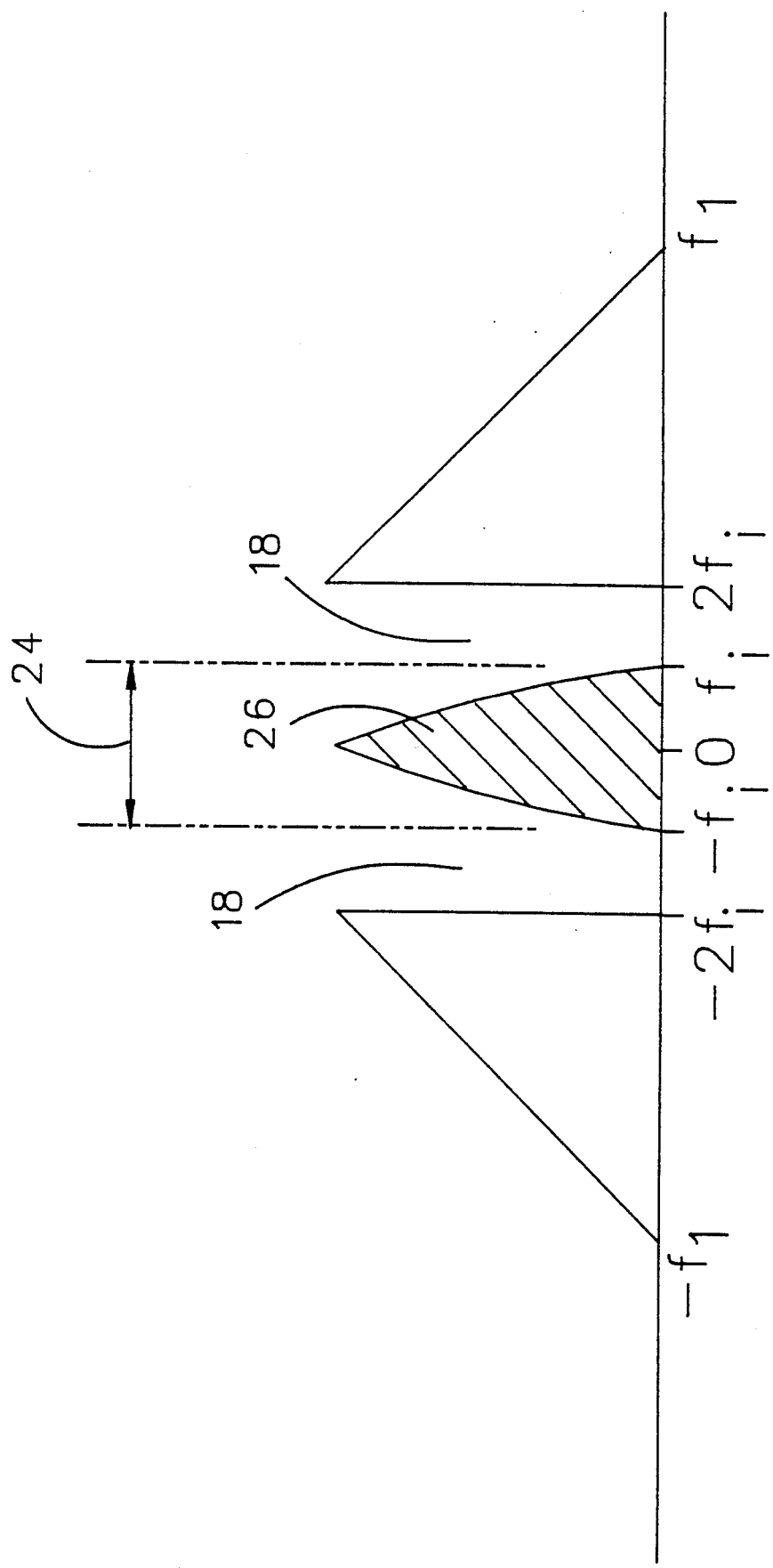
FIG. 2 shows the output spectrum when the spectrum of FIG. 1 is passed through a first anti-aliasing filter.
Figure 3:
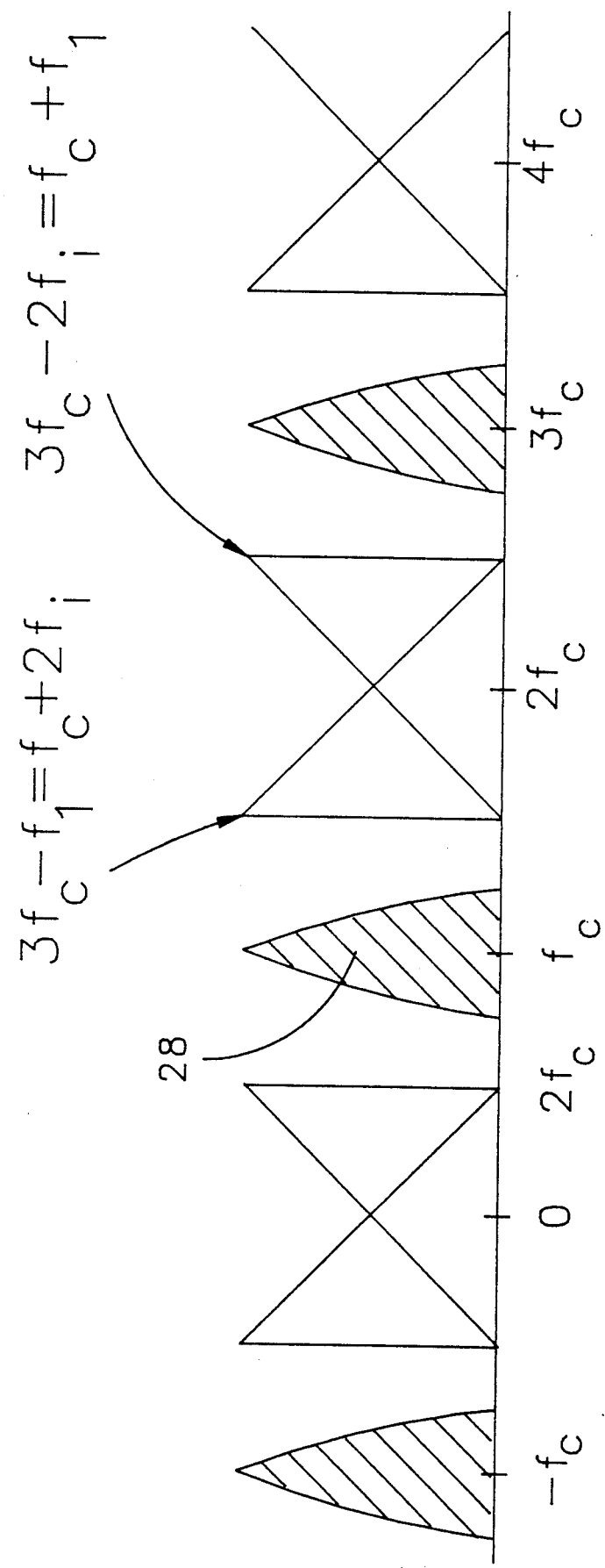
FIG. 3 shows the output spectrum when the spectrum of FIG. 2 is passed through a chopper.

In order to avoid chopper-induced aliasing, we must maintain the relationship $f1 < 2fc - 2fi$. This argument is graphically constructed in FIG. 3. The unity-gain passband 24 of the first anti-aliasing filter 20 is flat for the input band 14, $|f| \leq fi$. The frequency response for the guard band 18, $fi < |f| < 2fi$ is unimportant. A typical output spectrum for the waveform 26 between the first anti-aliasing filter 20 and the chopper 22 is shown in FIG. 2; a typical spectrum for the waveform 28 between the chopper 22 and a second anti-aliasing filter 30 is shown in FIG. 3. Notice that the spectrum 26 of FIG. 2, when replicated on the odd harmonics of the chopper frequency (as shown in FIG. 3), does not contain any aliasing of signal or noise onto the signal spectra 12 or into the guardbands 18. This is the purpose of the first anti-aliasing filter 20.

Figure 4:
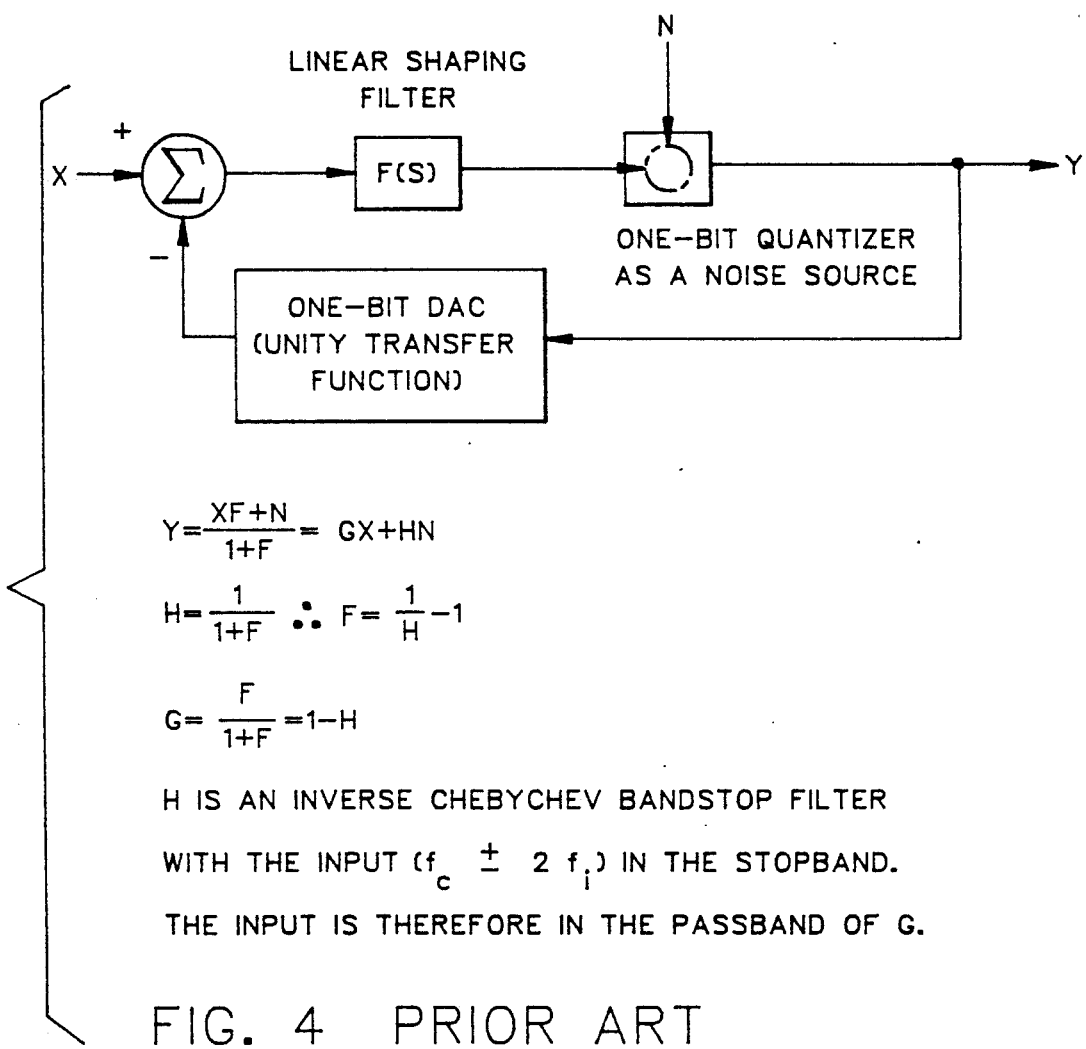
FIG. 4 shown the details of a one-bit modulator, such as is old in the art.

A one-bit modulator 32 (whose expansion is shown in FIG. 4) is for out immediate purposes a sampling switch operated at fs. Sampling at that rate is a whole new modulation process; i.e., there are new spectral components added which are the old spectra replicated at multiples of the new sampling frequency, then all of the spectra are added. The purpose of the second anti-aliasing filter 30 is to prevent the newly generated modulation products from falling on top of the signal spectra 12 or into the guardbands 18.

The second anti-aliasing filter 30 is unnecessary if the chopping frequency fc is an exact integer submultiple of the sampling frequency fs. In this case, the chopper signal may be applied directly to the modulator 32. Imposing this integer submultiple limitation on fc is usually so restrictive that the use of the second anti-aliasing filter 30 is a desirable alternative. The final decision between filtering and frequency matching is a design choice.

Figure 5:
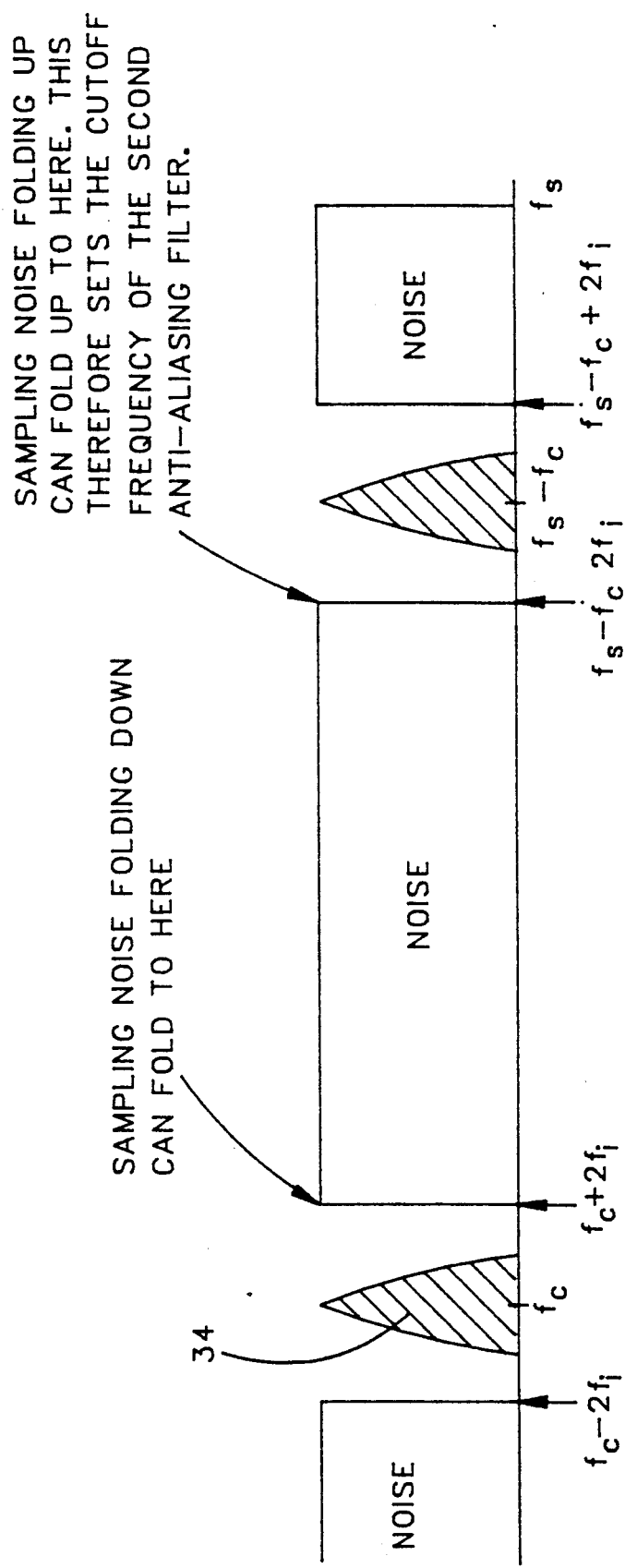
FIG. 5 shows the output spectrum when the spectrum of FIG. 3 is first passed through a second anti-aliasing filter and is then passed through the one-bit modulator of FIG. 4, such as is old in the art.
Figure 6:
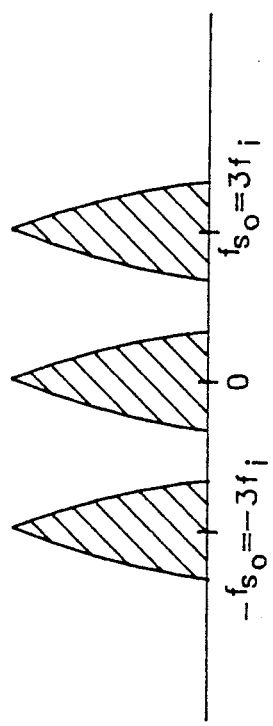
FIG. 6 shows the output spectrum when the spectrum of FIG. 5 is passed through a combination decimator/decimation filter/demodulator, such as is old in the art.

FIG. 5 shows the spectrum 34 at the output of the one-bit modulator 32. One can see from the graphical argument of FIG. 5 that if the second anti-aliasing filter 30 is a lowpass filter with unity gain in the band $fc - fi < f < fc + fi$, and with a cutoff frequency $f2 < fs - fc - 2fi$, then the anti-aliasing requirements are met.

A decimation filter 36, such as is old in the art, reduces the bandwidth of the one-bit modulator output 34 by repeatedly filtering out the top half of the spectrum, then dropping alternate samples of the output 34 until the sampling rate is just under $2(fc + fi)$. At that point we modulate the signal to baseband, then continue the decimation process until the output sample rate is 3fi.

A clock generator 38 drives the chopper 22, the one-bit modulator 32, and the decimation filter 36. As an example, $fs = 2^3 fc = 2^{16} fi$, and fi itself is about 100 Hz.

INDUSTRIAL APPLICABILITY

The present invention is capable of exploitation in industry, and can be used, whenever a low-cost, highaccuracy analog to digital converter is required. It can be made from components which, taken separate and apart from one another, are entirely conventional, or it can be made from their non-conventional counterparts.

While a particular embodiment has been described herein in some detail, the true scope and spirit of the present invention are not limited thereto, but only by the appended claims.

What is claimed is:

1. A method for one-bit sigma-delta modulating an input signal, the method comprising the steps of:
   (a) producing a first filter signal by first anti-alias filtering the input signal, the first anti-alias filtering step providing:
      (1) a flat gain over a baseband of frequencies, the absolute values of which are less than or equal to some pre-selected input frequency fi; and
      (2) a first cutoff frequency fl;
   (b) producing a chopper signal by chopping the first filter signal at a chopping frequency fc determined by a clock generator, the clock generator being connected to produce a sampling signal at a sampling frequency fs, and fc being characterized by fl being less than 2fc−2fi;
   (c) producing a second filter signal by second anti-alias filtering the chopper signal, the second anti-alias filtering step providing:
      (1) a flat gain over a band of frequencies from fc−fi to fc+fi; and
      (2) a second cutoff frequency f2 which is less than fs−fc−2fi; and
   (d) producing a modulator output signal by one-bit modulating the second filter signal with the sampling signal.

2. The method of claim 1, wherein the first cutoff frequency fl is approximately equal to 2fc−2fi.

3. The method of claim 1, wherein the second cutoff frequency f2 is approximately equal to fs−fc−2fi.

4. The method of claim 1, further comprising the step of decimating/demodulating the modulator output signal with the sampling signal.

5. A method for one-bit sigma-delta modulating an input signal, the method comprising the steps of:
   (a) producing a first filter signal by first anti-alias filtering the input signal, the first anti-alias filtering step providing:
      (1) a flat gain over a baseband of frequencies, the absolute values of which are less than or equal to some pre-selected input frequency fi; and
      (2) a first cutoff frequency fl;
   (b) producing a chopper signal by chopping the first filter signal at a chopping frequency fc determined by a clock generator, the clock generator being connected to produce a sampling signal at a sampling frequency fs, and fc being characterized by fl being less than 2fc−2fi and by fc being an exact integer submultiple of fs; and
   (c) producing a modulator output signal by one-bit modulating the chopper signal with the sampling signal.

6. The method of claim 5, wherein the first cutoff frequency fl is approximately equal to 2fc−2fi.

7. The method of claim 5, further comprising the step of decimating/demodulating the modulator output signal with the sampling signal.

8. An apparatus for one-bit sigma-delta modulating an input signal, the apparatus comprising:
   (a) means for producing a first filter signal, comprising means for first anti-alias filtering the input signal, the first anti-alias filtering means providing:
      (1) a flat gain over a baseband of frequencies, the absolute values of which are less than or equal to some pre-selected input frequency fi; and
      (2) a first cutoff frequency fl;
   (b) means for producing a chopper signal, comprising means for chopping the first filter signal at a chopping frequency fc determined by a clock generator, the clock generator being connected to produce a sampling signal at a sampling frequency fs, and fc being characterized by fl being less than 2fc−2fi;
   (c) means for producing a second filter signal, comprising means for second anti-alias filtering the chopper signal, the second anti-alias filtering means providing:
      (1) a flat gain over a band of frequencies from fc−fi to fc+fi; and
      (2) a second cutoff frequency f2 which is less than fs−fc−2fi; and
   (d) means for producing a modulator output signal, comprising means for one-bit modulating the second filter signal with the sampling signal.

9. The apparatus of claim 8, wherein the first cutoff frequency fl is approximately equal to 2fc−2fi.

10. The apparatus of claim 8, wherein the second cutoff frequency f2 is approximately equal to fs−fc−2fi.

11. The apparatus of claim 8, further comprising means for decimating/demodulating the modulator signal with the sampling signal.

12. An apparatus for one-bit sigma-delta modulating an input signal, the apparatus comprising:
   (a) means for producing a first filter signal, comprising means for first anti-alias filtering the input signal, the first anti-alias filtering means providing:
      (1) a flat gain over a baseband of frequencies, the absolute values of which are less than or equal to some pre-selected input frequency fi; and
      (2) a first cutoff frequency fl;
   (b) means for producing a chopper signal, comprising means for chopping the first filter signal at a chopping frequency fc determined by a clock generator, the clock generator being connected to produce a sampling signal at a sampling frequency fs, and fc being characterized by fl being less than 2fc−2fi and by fc being an exact integer submultiple of fs; and
   (c) means for producing a modulator output signal, comprising means for one-bit modulating the chopper signal with the sampling signal.

13. The apparatus of claim 12, wherein the first cutoff frequency fl is approximately equal to 2fc−2fi.

14. The apparatus of claim 12, further comprising means for decimating/demodulating the modulator signal with the sampling signal.

* * * * *